(12) United States Patent
Tseng et al.

(10) Patent No.: US 8,215,890 B2
(45) Date of Patent: Jul. 10, 2012

(54) SEMICONDUCTOR WAFER ROBOT ALIGNMENT SYSTEM AND METHOD

(75) Inventors: Kuo-Shu Tseng, Taipei County (TW); Yi-Chang Sung, Hsinchu County (TW); Chia-Chi Tsao, Taipei County (TW); Chih-Che Lin, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 547 days.

(21) Appl. No.: 12/403,077

(22) Filed: Mar. 12, 2009

(65) Prior Publication Data

US 2010/0234992 A1    Sep. 16, 2010

(51) Int. Cl.
*B65G 1/00* (2006.01)
*B65G 65/00* (2006.01)

(52) U.S. Cl. ........ 414/274; 414/936; 414/937; 414/938; 414/939; 414/940; 414/941; 414/935

(58) Field of Classification Search ............ 414/222.01–226.05, 403–425, 754–787, 935–941; 700/245, 700/250, 254, 253, 255, 258
See application file for complete search history.

(56) References Cited

U.S. PATENT DOCUMENTS

| | | | | |
|---|---|---|---|---|
| 4,951,601 A * | 8/1990 | Maydan et al. | | 118/719 |
| 5,092,729 A * | 3/1992 | Yamazaki et al. | | 414/225.01 |
| 5,217,341 A * | 6/1993 | Webber et al. | | 414/816 |
| 5,387,067 A * | 2/1995 | Grunes | | 414/217 |
| 5,417,537 A * | 5/1995 | Miller | | 414/217 |
| 5,438,418 A * | 8/1995 | Fukui et al. | | 356/399 |
| 5,563,798 A * | 10/1996 | Berken et al. | | 700/218 |
| 5,740,059 A * | 4/1998 | Hirata et al. | | 700/213 |
| 5,740,062 A * | 4/1998 | Berken et al. | | 700/218 |
| 5,783,834 A * | 7/1998 | Shatas | | 250/559.33 |
| 5,980,188 A * | 11/1999 | Ko et al. | | 414/416.09 |
| 5,980,194 A * | 11/1999 | Freerks et al. | | 414/754 |
| 5,988,971 A * | 11/1999 | Fossey et al. | | 414/416.01 |
| 6,024,393 A * | 2/2000 | Shamlou et al. | | 414/749.3 |
| 6,256,555 B1 * | 7/2001 | Bacchi et al. | | 700/245 |
| 6,300,644 B1 * | 10/2001 | Beckhart et al. | | 250/559.33 |
| 6,388,436 B1 * | 5/2002 | Nodot et al. | | 324/750.02 |
| 6,453,214 B1 * | 9/2002 | Bacchi et al. | | 700/245 |
| 6,454,327 B1 * | 9/2002 | Chang | | 294/213 |
| 6,618,645 B2 * | 9/2003 | Bacchi et al. | | 700/254 |
| 6,653,944 B2 * | 11/2003 | Huang et al. | | 340/687 |
| 6,763,281 B2 * | 7/2004 | Schauer et al. | | 700/218 |
| 6,813,543 B2 * | 11/2004 | Aalund et al. | | 700/245 |
| 6,889,818 B2 * | 5/2005 | Stacey | | 198/750.11 |
| 6,925,356 B2 * | 8/2005 | Schauer et al. | | 700/213 |
| 6,934,606 B1 * | 8/2005 | Genetti et al. | | 700/254 |
| 7,068,003 B2 * | 6/2006 | Cho | | 318/568.11 |

(Continued)

*Primary Examiner* — Khoi Tran
*Assistant Examiner* — Bhavesh V Amin
(74) *Attorney, Agent, or Firm* — Duane Morris LLP

(57) ABSTRACT

A method and system for aligning robotic wafer transfer systems provides a wafer cassette having one or more wafer slots having portions covered with an electrically conductive material and a sensor that is in electrical communication with the electrically conductive material. When a wafer is loaded into a wafer cassette such as may be contained within a wafer transfer module such as a FOUP, an indication of position is delivered to the sensor which detects the alignment and indicates if the loaded wafer undesirably contacts either or both of the opposed grooves that form the wafer slot of the wafer cassette. An indication of the wafer's position may be provided from the sensor to a controller that delivers a signal for aligning the wafer transfer blade of the wafer transfer robot responsive to the signal indicative of position.

22 Claims, 5 Drawing Sheets

U.S. PATENT DOCUMENTS

| | | | |
|---|---|---|---|
| 7,104,579 B2 * | 9/2006 | Casarotti et al. | 294/185 |
| 7,158,857 B2 * | 1/2007 | Schauer et al. | 700/218 |
| 7,661,544 B2 * | 2/2010 | Herzog | 211/41.18 |
| 2004/0154417 A1 * | 8/2004 | Renken et al. | 73/866.1 |

* cited by examiner

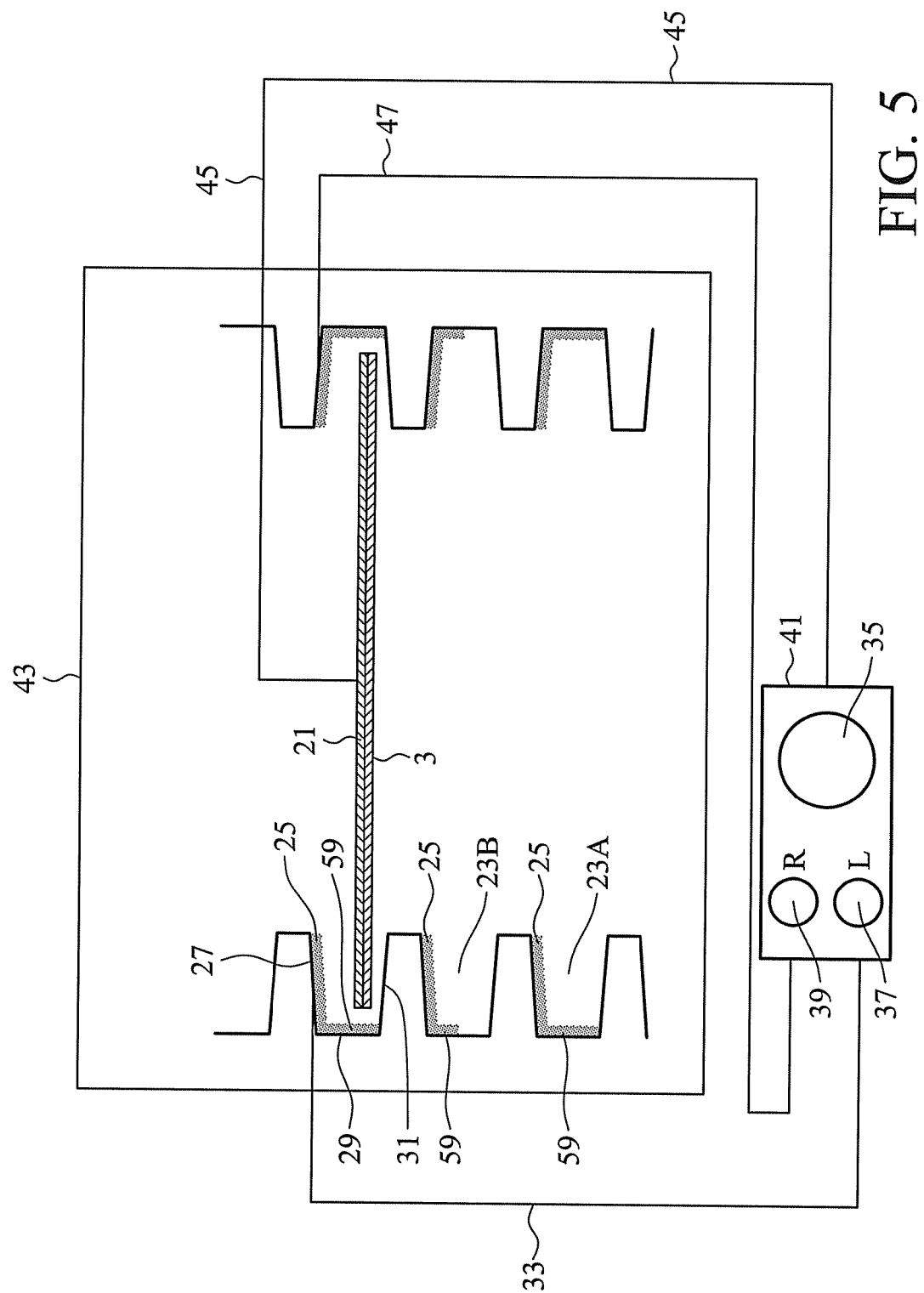

SEMICONDUCTOR WAFER ROBOT ALIGNMENT SYSTEM AND METHOD

FIELD OF THE INVENTION

The present invention relates, most generally, to semiconductor device manufacturing and, more particularly, to a method and system for calibrating and aligning a robotic wafer transfer system.

BACKGROUND

Robotics are commonly used in the semiconductor manufacturing industry to transfer semiconductor wafers, also known as substrates, throughout the fabrication area. Conventional wafer cassettes are typically used to retain a group of wafers that are commonly referred to collectively as a lot. Many times throughout the manufacturing process, the individual semiconductor wafers must be loaded into or out of the wafer cassettes. Various robotic wafer transfer systems may be used. In many cases, the wafer cassette is disposed within a transportable wafer transfer module such as a FOUP, front opening unified pod, when the transfer of semiconductor wafers into or out of the cassette takes place. The robotic systems typically utilize a blade that transfers the individual wafers into and out of slots of the wafer cassette. It is important that the semiconductor wafer is accurately and precisely aligned with respect to the slots during these transfers. If the semiconductor wafer is not aligned accurately and precisely with respect to the slots, the wafer can be scratched or shattered, dispersing particles and contaminating all of the other wafers in the lot, the cassette itself, the wafer transfer module, the wafer transfer system itself, and the associated semiconductor processing equipment.

Correct alignment is more critical and challenging as wafer sizes increase from six to eight to ten to twelve inches in diameter or greater and also when wafers are being loaded into cassettes disposed in a wafer transfer module as the relationship between the cassette and the wafer transfer module, e.g. FOUP, introduces another alignment issue. The robotics systems that provide the wafer blade to transfer wafers into and out of cassettes may consist of multiple pulleys and belts and various pneumatic systems and other positioning devices. It is therefore a challenge to assure that the multiple components of the robotics system work cohesively to produce accurate alignment. When loading a wafer into a slot of a wafer cassette, it is therefore quite challenging to ensure proper alignment of the wafer with respect to the wafer cassette in the x-direction, y-direction and z-direction.

There are conventional methods for calibrating and adjusting the alignment of a wafer transfer blade and therefore the semiconductor wafer with respect to the slots of the wafer cassette, but these calibration/alignment methods are typically time and labor intensive. Many calibration/alignment techniques require multiple measurements to be made with the wafer blade in various stages of extension. Complex algorithms are often used to evaluate the alignment based on multiple measurements. Oftentimes, the multiple measurements require at least partial disassembly of the front opening unified pod to calibrate the instruments. Typically, a side door must be opened. A plurality of data points is typically analyzed and based on the data analysis, instructions for adjusting the robot position are generated. Many recommended alignment procedures take as long as six hours to complete. In addition, many procedures also require tools and/or instrumentation from outside vendors. Moreover, when wafer transfer modules such as the FOUP are opened to check positioning and alignment, particle testing is required afterwards before the wafer transfer module can be returned to production use. The resulting unavailability of the wafer transfer robotic system carries with it an associated financial impact and significantly increases cycle time for the semiconductor devices being manufactured.

It would therefore be desirable to calibrate the alignment of a robotic wafer transfer system in a reliable, efficient and expedited manner.

SUMMARY OF THE INVENTION

To address these and other needs and in view of its purposes, the invention provides a method for calibrating alignment of a robotic wafer transfer system that includes a wafer transfer blade. The method includes providing a wafer cassette with wafer slots oriented generally horizontally; positioning an electrically conductive material on corresponding upper surfaces of opposed grooves of at least a first wafer slot of the wafer slots, the electrically conductive material in electrical communication with a sensor that detects when a wafer contacts the electrically conductive material. The method further provides transferring a wafer disposed on the wafer transfer blade from a load location to the first wafer slot and sensing a position of the wafer as loaded into the first wafer slot of the wafer cassette.

According to another aspect, provided is an apparatus for calibrating alignment of a robotic wafer transfer system. The apparatus comprises a wafer cassette with wafer slots disposed generally horizontally; an electrically conductive material on at least upper surfaces of opposed grooves of at least a first wafer slot of the wafer slots; a sensor that detects when a wafer contacts the electrically conductive material, the sensor in electrical communication with the electrically conductive material. Also provided is a wafer transfer blade capable of delivering the wafer to each of the wafer slots and a controller that aligns the wafer transfer blade responsive to a signal indicative of a position of the wafer delivered by the sensor.

According to another aspect, provided is a wafer cassette for calibrating a robotic wafer transfer system. The wafer cassette includes a plurality of wafer slots. At least a first wafer slot of the plurality of wafer slots includes at least one electrically conductive surface, the electrically conductive surface electrically coupled to a sensor that detects when a wafer contacts the electrically conductive surface.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing. Included in the drawing are the following figures:

FIG. 5 is a front view in partial cross-section, showing another embodiment of a wafer transfer system in accordance with the invention.

DETAILED DESCRIPTION

The invention provides an alignment and calibration system usable in conjunction with various robotics systems used for wafer transfer in the semiconductor manufacturing industry. The calibration process may be carried out as a wafer is being loaded into a wafer cassette oriented such that the wafer slots and the loaded wafers are generally horizontal. This advantageous embodiment will be described throughout the specification and represents the orientation illustrated in the figures, but it should be understood that the principles of the invention apply equally to the loading of semiconductor wafers into wafer cassettes oriented vertically or in other orientations. The horizontally oriented wafer cassette may be disposed at any desired load location such as a receive position associated with a semiconductor manufacturing tool. According to one exemplary embodiment, the wafer cassette may be advantageously disposed within a wafer transfer module or pod such as a front opening unified pod, FOUP, that is disposed in a receive position on a loading assembly or on a semiconductor manufacturing tool. The system and method of the invention can be used to calibrate alignment in the x, y, and z directions.

Figure 1:
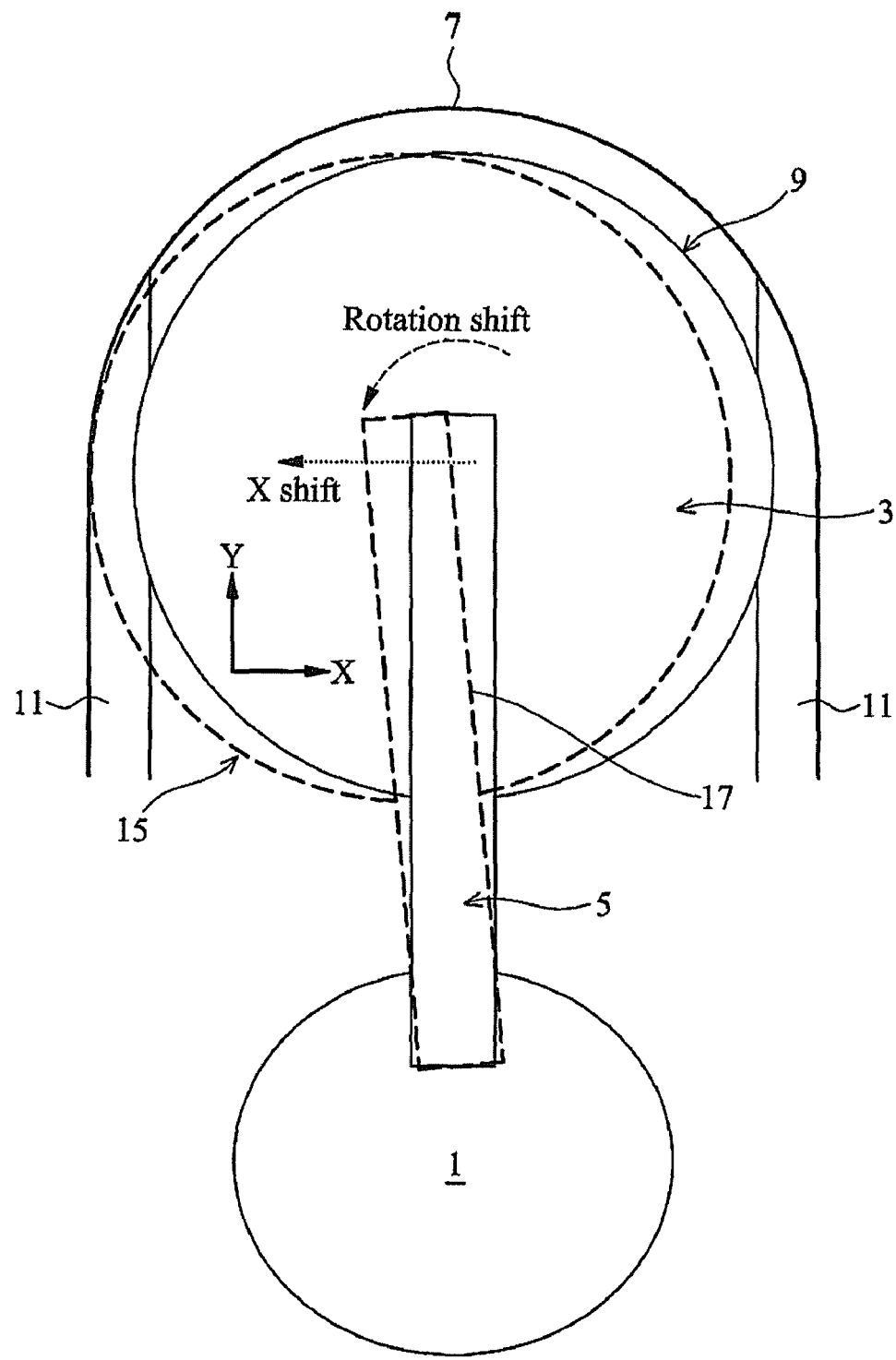
FIG. 1 is a top, plan view of a wafer transfer system in accordance with the invention.

FIG. 1 is a plan view of a wafer transfer system in accordance with the invention including robot 1 with wafer 3 on blade 5. Wafer 3 may be any semiconductor or other wafer used in the semiconductor manufacturing industry and may be of various dimensions used in the semiconductor manufacturing industry. According to various exemplary embodiments, wafer 3 may have a diameter ranging from 3-14 inches. Blade 5 is a conventional member capable of retrieving and delivering wafer 3 to various locations. Typically the bottom surface of wafer 5 is disposed on the upper surface of blade 5. In some embodiments blade 5 is capable of gripping wafer 3 such as by use of a vacuum. Wall 7 represents the periphery of a wafer slot of a wafer cassette and position 9 represents wafer 3 loaded substantially in the correct position, i.e. properly aligned in the x and y directions. The wafer slot also includes surfaces 11 upon which wafer 3 desirably rests when blade 5 is removed. The dashed lines represent wafer position 15 and wafer blade position 17 when wafer 3 is misaligned with respect to the wafer slot defined by and bounded by peripheral wall 7.

Figure 2:
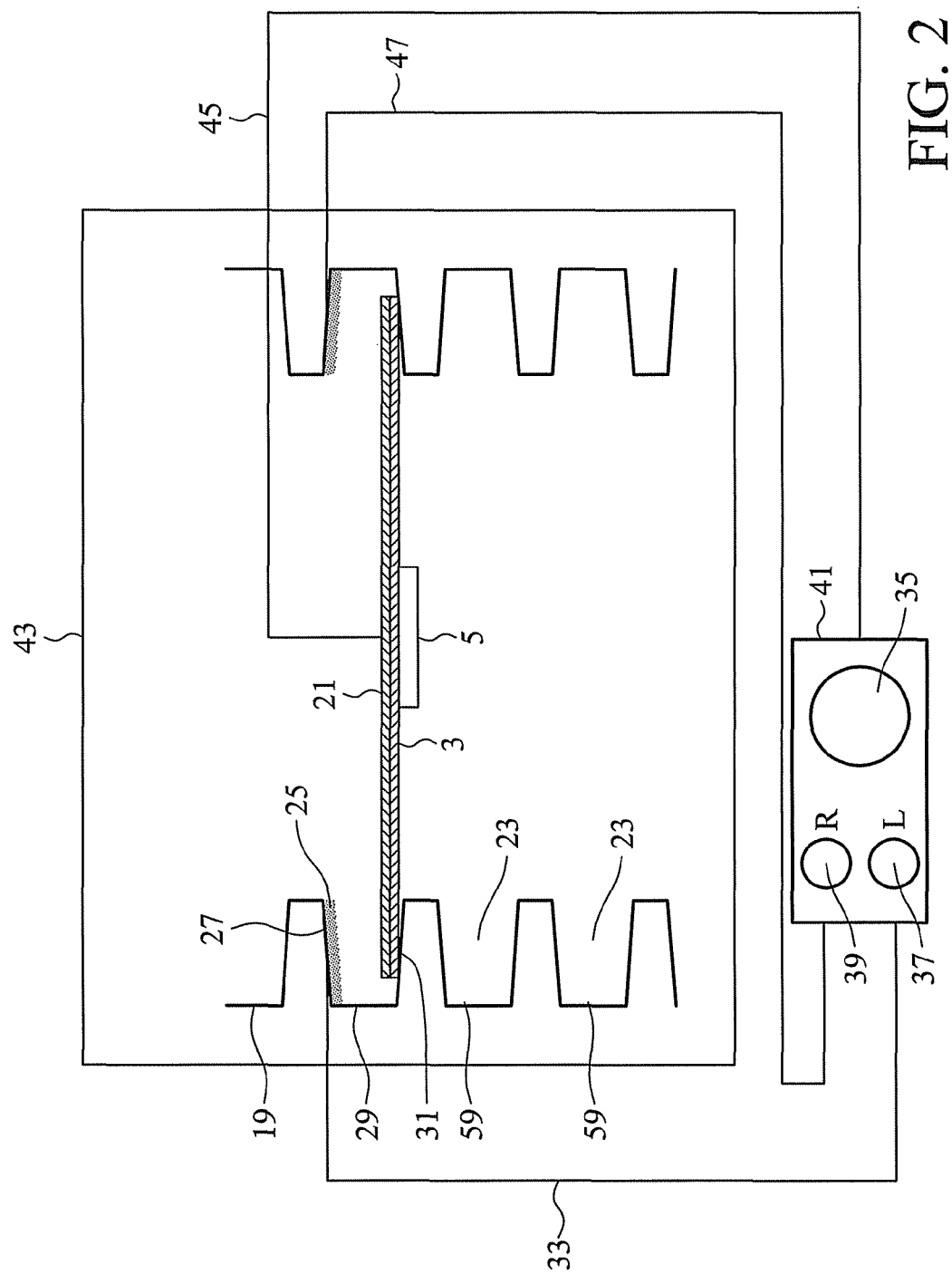
FIG. 2 is a front view in partial cross-section, of a wafer transfer system in accordance with the invention in which a wafer is substantially correctly aligned.

FIG. 2 is a front view in partial cross-section of a wafer transfer system in accordance with the invention in which wafer 3 is loaded into a position in slot 23 of wafer cassette 19 by blade 5. Wafer cassette 19 comprises a plurality of slots 23 capable of accommodating a plurality of wafers 3. Blade 5 is part of robot 1, not otherwise shown. Each slot 23 comprises opposed grooves that serve as receptacles for opposed edges of a wafer, each groove defined by and including upper surface 27, side surfaces 29, and lower surface 31 with respect to the illustrated orientation. Side surfaces 29 represent lateral boundaries of the void area of the horizontally oriented grooves that combine to form slots 23. In FIG. 2, wafer 3 is substantially correctly aligned and rests on the opposed set of bottom surfaces 31 of a first slot 23, in this example the uppermost slot 23 in wafer cassette 19. Wafer cassette 19 may be positioned in a wafer transfer module 43 that may be used to transfer one or more cassettes of wafers from one manufacturing tool to another. In one exemplary embodiment, wafer transfer module 43 may be a FOUP. Electrically conductive material 25 is disposed on upper surface 27 of each of the set of opposed grooves that combine to form slot 23 essentially rendering upper surfaces 27 electrically conductive surfaces. Electrically conductive material 25 may be a foil or wire or various other suitable electrically conductive materials, and is in electrical communication with a sensor 41 that detects when a wafer contacts electrically conductive materials 25. In the illustrated exemplary embodiment, wires 33 and 47 electrically couple each of their respective electrically conductive materials 25 to sensor 41, but according to other exemplary embodiments, wireless or other electrical communication modes may be used to provide electrical communication between sensor 41 and electrically conductive materials 25. In the illustrated embodiment, wafer 3 is a test wafer and includes conductive film 21 thereon. Conductive film 21 of wafer 3 is also coupled to sensor 41 via wire 45, which could be replaced by other electrical communication modes in alternative embodiments.

Various conventional sensors may be used for sensor 41 which is capable of detecting contact between wafer 3 and electrically conductive material 25 disposed on either or both of the grooves disposed on opposed sides of wafer cassette 19 that form a slot 23. In one exemplary embodiment, sensor 41 may include audio buzzer 35 indicating contact between wafer 3 and either of the opposed electrically conductive materials 25. The separate electrical connections, such as wires 33 and 47, to the conductive materials disposed on the two opposed grooves in a slot 23 make it possible for the sensor 41 to indicate which of the opposed grooves the wafer 3 is contacting. Left indicator light 37 and right indicator light 39 of sensor 41 may be respectively associated with the left and right grooves of slot 23 in the illustrated orientation. According to an exemplary embodiment in which contact is made only between conductive film 21 of wafer 3 and the electrically conductive material 25 that is disposed on the left groove of slot 23, only left indicator light 37 would be illuminated. In other words sensor 41 is capable of independently sensing contact between wafer 3 and the electrically conductive materials 25 on the respective opposed grooves that together produce slot 23.

Wafer cassette 19 may be formed of various suitable materials used in the semiconductor manufacturing industry including various plastics, or other materials that are electrically insulating and resistant to electrostatic discharge damage. Although wafer cassette 19 illustrated in FIG. 2 comprises only three full slots 23, it should be understood that wafer cassette 19 may include various numbers of slots and often includes twenty-five (25) wafer slots. Other configurations may be used in various other embodiments.

Figure 3:
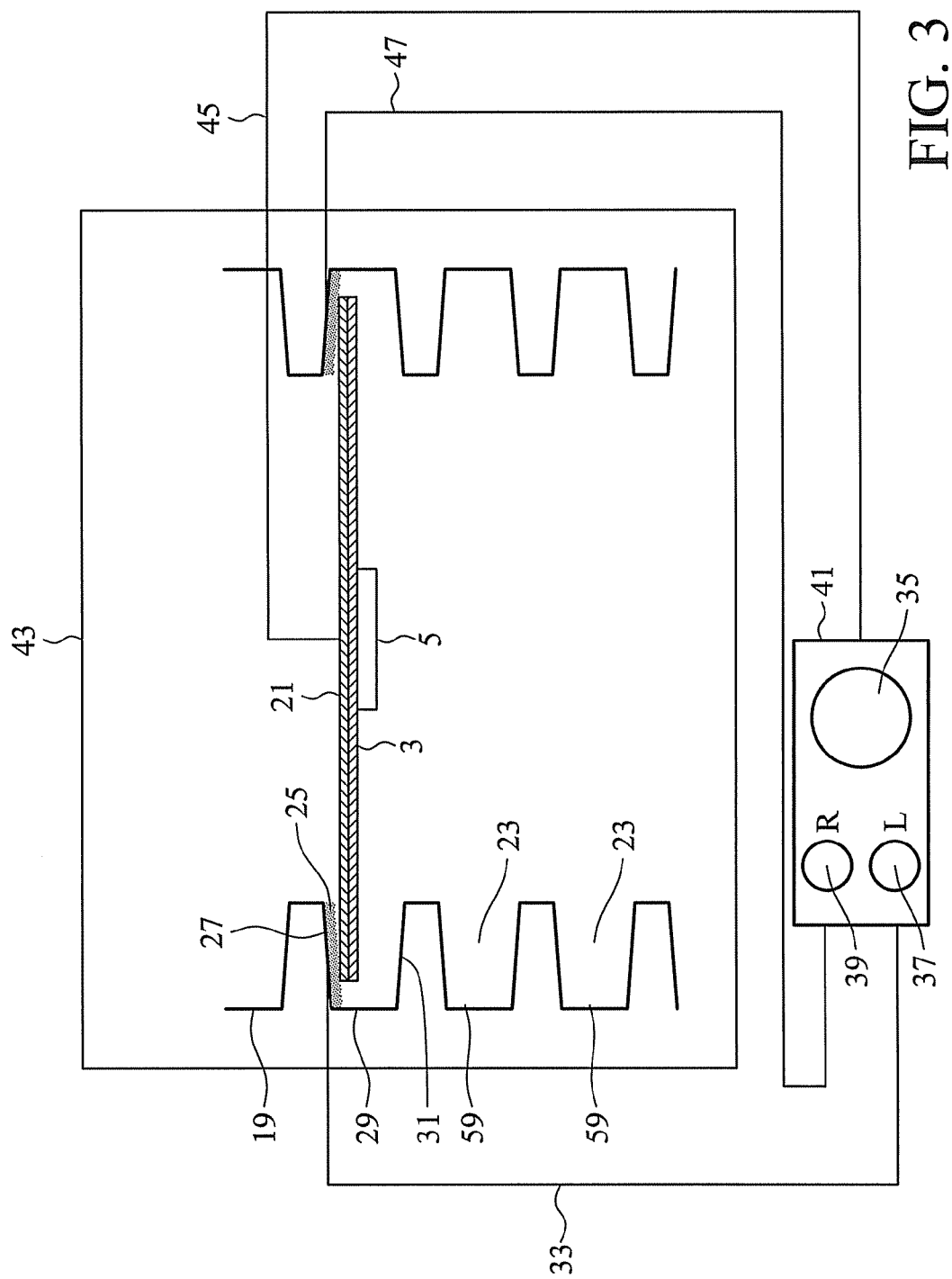
FIG. 3 is a front view in partial cross-section, of a wafer transfer system in accordance with the invention in which a wafer is misaligned.

FIG. 3 shows an arrangement when wafer 3 is misaligned within the embodiment shown in FIG. 2 as a result of being positioned too high within slot 23 by the robotic wafer transfer system. The misalignment is in the z direction according to the Cartesian coordinates system shown in FIG. 1. According to this illustrated embodiment, the upper surface, i.e. conductive film 21 of wafer 3, is in contact with each of opposed electrically conductive materials 25 disposed on opposed upper surfaces 27 of slot 23. According to this exemplary embodiment, each of left indicator light 37 and right indicator light 39 is illuminated and buzzer 35 sounds indicating improper alignment, i.e. blade 5 of the robotic wafer transfer system has positioned wafer 3 too high in slot 23.

Figure 4:
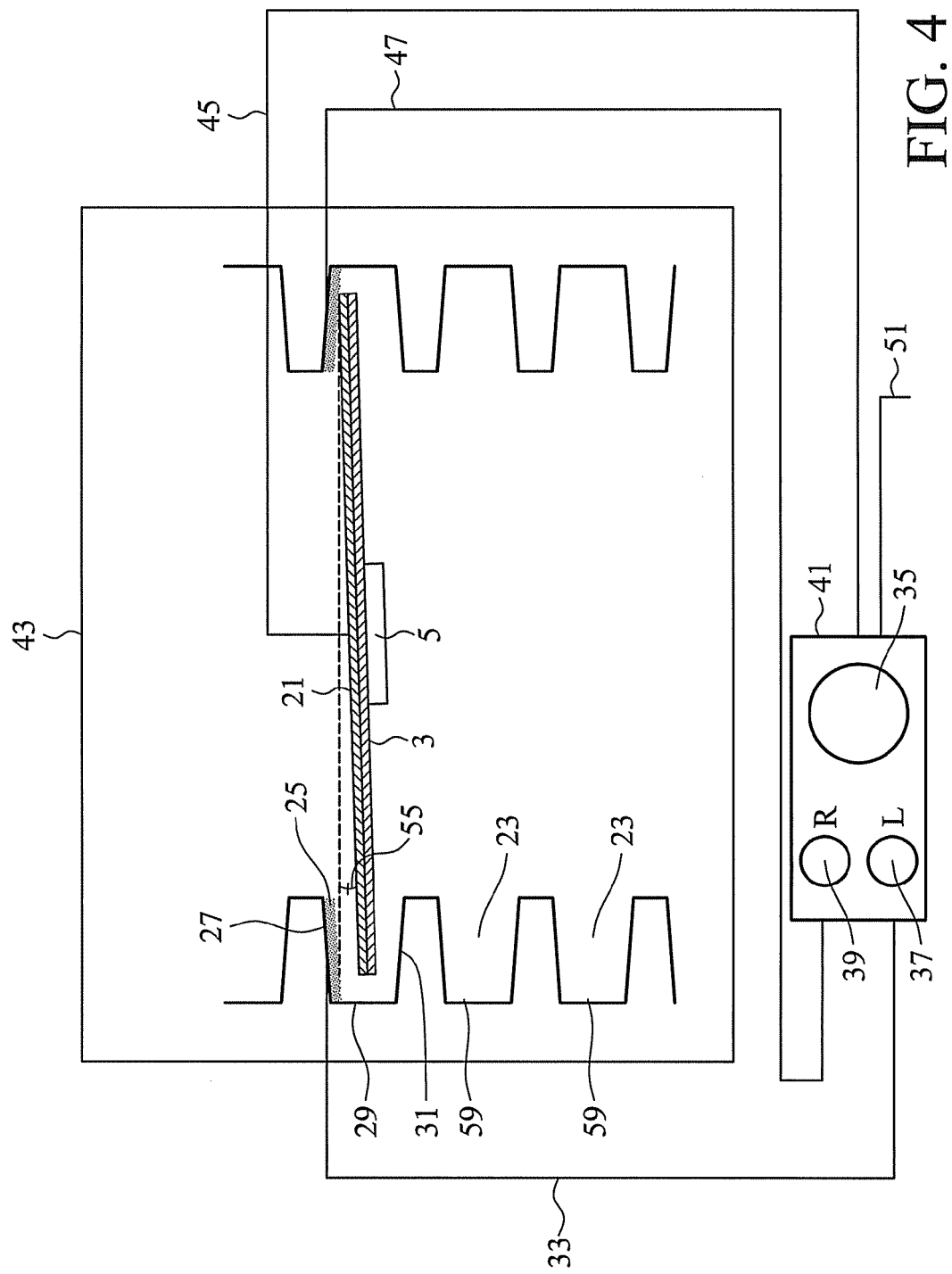
FIG. 4 is a front view in partial cross-section, of a wafer transfer system in accordance with the invention in which a wafer is misaligned.

FIG. 4 shows another arrangement in which wafer 3 is misaligned with respect to slot 23. In particular, wafer 23 is tilted in slot 23. According to this exemplary embodiment only the right hand side of wafer 3 makes contact with electrically conductive material 25 disposed on upper surface 27 of the right hand groove of slot 23. On the left hand side of the illustrated embodiment, wafer 3 does not contact upper surface 27 of slot 23. According to this illustrated embodiment, the robotic wafer transfer system, i.e. robot 1, has tilted wafer 3 at an angle 55 with respect to the horizontal and according to this exemplary embodiment, only right indicator light 39 is illuminated but not left indicator light 37. Electrical wire 51 delivers an output signal as is discussed infra.

FIG. 5 illustrates wafer 3 substantially properly aligned such as also shown in FIG. 2, and shows an alternative embodiment of a wafer transfer system in accordance with the invention. According to various exemplary embodiments, a plurality of slots 23 may include electrically conductive material 25 formed thereon so that misalignment of wafer 3 may be detected within multiple slots 23 within wafer cassette 19. Furthermore, in the embodiment in FIG. 5, slots 23, 23A and 23B of wafer cassette 19 include electrically conductive material 59 extending along their respective sides 29. The electrically conductive material 59 may extend along the entire length of surface 29 such as in wafer slot 23A or only partially along surface 29 as in exemplary slot 23B. The presence of electrically conductive material 59 on the sides 29 of slots 23, 23A and 23B allows horizontal misalignment, such as misalignment along the y-axis (as shown in FIG. 1) to be detected by the sensor 41.

According to either of the aforementioned embodiments, when contact is detected by sensor 41 indicating contact between conductive film 21 of wafer 3 and electrically conductive material 25 or 59 of either or both of opposed slots 23 of wafer cassette 19, an audio or visual indication is generated by sensor 41 and an outgoing signal indicative of the wafer 3 position is sent through wire 51 (see FIG. 4). The outgoing signal may be sent to a controller, not shown, that provides feedback to robot 1 to calibrate the alignment thereby correcting any misalignment. According to one exemplary embodiment, after outgoing signal indicative of position is generated at a first slot and delivered to a controller through wire 51, wafer 3 is loaded into another slot or other slots and a corresponding outgoing signal indicative of position is generated for each additional slot 23 and delivered to the controller through wire 51. The outgoing signals collectively indicate any drift in alignment throughout the range of the wafer blade. The controller then provides feedback to robot 1 to calibrate the alignment, if necessary, based on the plurality of outgoing signals.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. In particular, the method and system may be utilized for wafers loaded into wafer cassettes vertically or at other angles. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for calibrating alignment of a robotic wafer transfer system that includes a wafer transfer blade, said method comprising:
   providing a wafer cassette with a plurality of wafer slots oriented generally horizontally, wherein each of said plurality of wafer slots comprises opposed grooves, and wherein each of said opposed grooves comprises an upper surface, a side surface, and a lower surface;
   positioning an electrically conductive material on each of said upper surfaces of said opposed grooves of a first wafer slot of said plurality of wafer slots, said electrically conductive material in electrical communication with a sensor that detects when a wafer contacts said electrically conductive material;
   transferring a wafer disposed on said wafer transfer blade into said first wafer slot; and
   determining whether said wafer is misaligned within said first wafer slot.

2. The method as in claim 1, further comprising delivering an indication of misalignment to a controller and calibrating alignment of said wafer transfer blade based on said indication.

3. The method as in claim 1, wherein said providing a wafer cassette comprises placing said wafer cassette in a wafer transfer module.

4. The method as in claim 3, wherein said wafer transfer module comprises a front opening unified pod (FOUP).

5. The method as in claim 1, wherein said providing a wafer cassette comprises placing said wafer cassette in a receive position on a semiconductor manufacturing tool.

6. The method as in claim 1, wherein said providing a wafer cassette comprises placing said wafer cassette in a wafer transfer module in a receive position of a semiconductor manufacturing tool.

7. The method as in claim 1, wherein said determining comprises said sensor independently sensing contact between each of said opposed grooves, and said wafer.

8. The method as in claim 1, further comprising disposing said electrically conductive material on said respective side surfaces of said opposed grooves of said first wafer slot.

9. The method as in claim 1, wherein said determining further comprises delivering an alarm, said alarm being at least one of an audio alarm and a visual alarm.

10. The method as in claim 1, wherein said determining further comprises delivering a visual alarm being at least one of illumination of a first light indicating contact of said wafer with a first groove of said opposed grooves of said first wafer slot and illumination of a second light indicating contact of said wafer with the other of said opposed grooves of said first wafer slot.

11. The method as in claim 1, wherein said electrically conductive material comprises foil or wire.

12. The method as in claim 1, further comprising providing an electrically conductive material on a surface of said wafer and in electrical communication with said sensor.

13. The method as in claim 2, wherein said plurality of wafer slots also comprises a second wafer slot, and said method further comprises, after said transferring:
transferring said wafer to said second wafer slot;
determining whether said wafer is misaligned within said second wafer slot;
delivering an indication of misalignment within said second wafer slot to said controller; and
calibrating alignment of said wafer transfer blade based on said indication.

14. A system for calibrating alignment of a robotic wafer transfer system, said system comprising:
a wafer cassette with a plurality of wafer slots disposed generally horizontally, wherein each of said plurality of wafer slots comprises opposed grooves, and wherein each of said opposed grooves comprises an upper surface, a side surface, and a lower surface;
an electrically conductive material on said upper surfaces of said opposed grooves of at least a first wafer slot of said plurality of wafer slots;
a sensor that detects when a wafer contacts said electrically conductive material, said sensor in electrical communication with said electrically conductive material;
a wafer transfer blade capable of delivering said wafer to each of said wafer slots;
a controller that aligns said wafer transfer blade responsive to a signal indicative of a position of said wafer delivered by said sensor.

15. The system as in claim 14, wherein said electrically conductive material comprises foil or wire.

16. The system as in claim 15, wherein said sensor delivers a visual alarm being at least one of illumination of a first light indicating contact of said wafer with a first one of said opposed grooves of said first wafer slot and illumination of a second light indicating contact of said wafer with the other of said opposed grooves of said first wafer slot.

17. The system as in claim 15, further comprising electrically conductive material disposed on said side surfaces of said opposed grooves of said first wafer slot.

18. A wafer cassette for calibrating a robotic wafer transfer system, said wafer cassette comprising a plurality of wafer slots, said plurality of wafer slots comprising a first wafer slot comprising at least one electrically conductive surface, said electrically conductive surface electrically coupled to a sensor that detects when a wafer contacts said electrically conductive surface.

19. The wafer cassette as in claim 18, wherein said electrically conductive surface comprises foil or wire.

20. The wafer cassette as in claim 18, wherein each of said plurality of wafer slots comprises a pair of opposed grooves for receiving respective opposed edges of said wafer.

21. The wafer cassette as in claim 20, further comprising said electrically conductive surface disposed on at least a few other wafer slots of said plurality of wafer slots.

22. The system as in claim 14, further comprising said electrically conductive material on respective upper surfaces of respective opposed grooves of at least a few additional wafer slots of said plurality of wafer slots.

* * * * *